(12) United States Patent
Zhang et al.

(10) Patent No.: US 10,340,455 B2
(45) Date of Patent: Jul. 2, 2019

(54) MANUFACTURING METHOD OF MASK PLATE ASSEMBLY WITH COLLOID

(71) Applicant: BOE TECHNOLOGY GROUP CO., LTD., Beijing (CN)

(72) Inventors: Can Zhang, Beijing (CN); Yinan Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 63 days.

(21) Appl. No.: 15/322,140

(22) PCT Filed: Feb. 25, 2016

(86) PCT No.: PCT/CN2016/074507
§ 371 (c)(1),
(2) Date: Dec. 26, 2016

(87) PCT Pub. No.: WO2016/155433
PCT Pub. Date: Oct. 6, 2016

(65) Prior Publication Data
US 2017/0155052 A1  Jun. 1, 2017

(30) Foreign Application Priority Data
Mar. 31, 2015  (CN) .......................... 2015 1 0148452

(51) Int. Cl.
*B05D 7/14* (2006.01)
*B29C 65/00* (2006.01)
(Continued)

(52) U.S. Cl.
CPC ............ *H01L 51/0011* (2013.01); *B05D 7/14* (2013.01); *C23C 14/042* (2013.01); *H01L 51/56* (2013.01);
(Continued)

(58) Field of Classification Search
CPC ... H01L 51/0011; H01L 51/56; C23C 14/042; B05D 7/14; B29C 66/324; B29C 66/472; B29C 65/7855
See application file for complete search history.

(56) References Cited

U.S. PATENT DOCUMENTS 6,890,385 B2 * 5/2005 Tsuchiya ............... C23C 14/042
                                                         118/504
6,893,709 B2 * 5/2005 Kitazume ................. B32B 3/10
                                                         118/504
(Continued)

FOREIGN PATENT DOCUMENTS

CN       101250685A A   8/2008
CN       103143868A A   6/2013
(Continued)

OTHER PUBLICATIONS

Chinese First Office Action for Chinese Application No. 201510148452.9, dated Nov. 30, 2016, 5 pages.
(Continued)

*Primary Examiner* — Mohsen Ahmadi
*Assistant Examiner* — Scott E Bauman
(74) *Attorney, Agent, or Firm* — Brooks Kushman P.C.

(57) ABSTRACT

The present disclosure provides a method for manufacturing a mask plate assembly, which includes providing a mask plate and a frame and securing the mask plate to the frame. The secured mask plate comprises a redundant portion extending out of the frame. The method further comprises removing at least a part of the redundant portion, and dispensing glue in a predetermined area of a surface of the mask plate, and curing the glue to form a colloid, wherein the colloid is higher than any other area on the surface of the mask plate where the colloid is not formed. The present disclosure further provides a mask plate assembly comprising a frame, and a mask plate secured to the frame, wherein a colloid is formed in a predetermined area of a surface of the mask plate, and the colloid is higher than any other area on the surface of the mask plate where the colloid is not formed. The present disclosure further provides an evapo-
(Continued)

ration device and a method for manufacturing the display substrate.

4 Claims, 4 Drawing Sheets

(51) Int. Cl.
    *B29C 65/78*     (2006.01)
    *C23C 14/04*     (2006.01)
    *H01L 51/00*     (2006.01)
    *H01L 51/56*     (2006.01)

(52) U.S. Cl.
    CPC ........ *B29C 65/7855* (2013.01); *B29C 66/324* (2013.01); *B29C 66/472* (2013.01)

(56) References Cited

U.S. PATENT DOCUMENTS

| | | | |
|---|---|---|---|
| 7,537,798 B2* | 5/2009 | Shigemura | H01L 51/0004 118/721 |
| 7,648,729 B2* | 1/2010 | Nakadate | B29C 65/4875 427/64 |
| 2015/0207108 A1* | 7/2015 | Choi | C23C 14/042 118/712 |
| 2015/0322562 A1* | 11/2015 | Pan | B23K 26/00 427/272 |

FOREIGN PATENT DOCUMENTS

| | | |
|---|---|---|
| CN | 103668056A A | 3/2014 |
| CN | 103981485 A | 8/2014 |
| CN | 104062842 A | 9/2014 |
| CN | 104097027 A | 10/2014 |
| CN | 104862646 A | 8/2015 |
| JP | 2005344201 A | 12/2005 |

OTHER PUBLICATIONS

International Search Report and Written Opinion for Application No. PCT/CN2016/074507, dated Jun. 1, 2016, 14 pages.

\* cited by examiner

MANUFACTURING METHOD OF MASK PLATE ASSEMBLY WITH COLLOID

CROSS-REFERENCE TO RELATED APPLICATIONS

This application is the U.S. national phase of PCT Application No. PCT/CN2016/074507 filed on Feb. 25, 2016, which claims priority to Chinese Patent Application No. 201510148452.9 filed on Mar. 31, 2015, the disclosures of which are incorporated in their entirety by reference herein.

TECHNICAL FIELD

The present disclosure relates to an organic light emitting diode (OLED) display, and in particular to a mask plate assemble and a manufacturing method thereof, an evaporation device and a manufacturing method of a display substrate.

BACKGROUND

The OLED displays are recognized by the industry as the third-generation display technology after liquid crystal displays (LCDs), due to their numerous advantages such as light and thin, active luminescence, fast response, wide viewing angle, rich colors and high brightness, low power consumption, and high and low temperature resistance. The OLED displays are currently widely used in smart phones, tablet computers, televisions and other terminal products.

At present, in the manufacturing process of the OLEDs, evaporation procedure is implemented by a fine metal mask (FMM) to form a film on the substrate. As shown in FIG. 1, the FMM mainly includes a frame 2 and a mask plate 3. The mask plate is welded onto the frame. Generally, the mask plate is slightly longer than a length of a corresponding reserved portion on the frame, facilitating to weld the mask plate onto the frame. When the welding is completed, a redundant portion at the edge of the mask plate is removed. During the removing, the edge of the mask plate may be warped by a stress, which may adversely affect an attachment of the mask plate onto the substrate during the evaporation process, resulting in shadow effects near the edges of the formed pixel area. Further, during the welding, as shown in FIG. 1, solder joints 31 are formed, which will cause roughness in the surface of the mask plate.

SUMMARY

(1) Technical Problem to be Solved

The present disclosure aims to provide a mask plate assembly, a display device and manufacturing methods, so as to attach the mask plate to the substrate more flatly, thereby improving the evaporation quality of the pixels.

(2) Technical Solution

In one aspect, the present disclosure provides in some embodiments a method for manufacturing a mask plate assembly, which includes: providing a mask plate and a frame; securing the mask plate to the frame, wherein the secured mask plate includes a redundant portion extending out of the frame; removing at least a part of the redundant portion; and dispensing glue in a predetermined area of a surface of the mask plate, and curing the glue to form a colloid, wherein the colloid is higher than any other area on the surface of the mask plate where the colloid is not formed.

Optionally, the method further includes: forming on the mask plate a cutting line corresponding to a shape of the frame, prior to weld the mask plate on the frame.

Optionally, the step of removing at least the part of the redundant portion includes: cutting off the part of the redundant portion along the cutting line.

Optionally, the step of dispensing the glue in the predetermined area of the surface of the mask plate including: dispensing the glue in an area near an edge of the mask plate, so that the cured colloid is capable of covering solder joints and a warped portion of the mask plate.

Optionally, the step of securing the mask plate to the frame including: welding the mask plate on the frame.

In another aspect, the present disclosure provides in some embodiments a mask plate assembly including: a frame; and a mask plate secured to the frame, wherein a colloid is formed in a predetermined area of a surface of the mask plate, and the colloid is higher than any other area on the surface of the mask plate where the colloid is not formed.

Optionally, the colloid is made of an elastic material, e.g. a silicon rubber.

Optionally, a width of the colloid is not less than 2000 μm, and a height of the colloid is in a range from 50 μm to 100 μm.

In yet another aspect, the present disclosure provides in some embodiments an evaporation device which includes the above-mentioned mask plate assembly.

In still yet another aspect, the present disclosure provides in some embodiments a method for manufacturing a display panel including: forming pixels on a substrate through an evaporation process by the above mask plate assembly.

(3) Advantageous Effects

The above-mentioned technical solutions of the present disclosure have the following advantageous effects: in the solution of the present disclosure, the mask plate is indirectly attached to the substrate by the colloid formed on the surface of the mask plate, resulting in a flatter attachment effect, that is, the opening of the mask plate is more strictly parallel to the substrate. Therefore, in the evaporation process using the mask plate assembly, pixels can be more accurately formed in predetermined pixel areas through the opening, so as to improve the display quality.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure will be described hereinafter in conjunction with the drawings and embodiments. The following embodiments are for illustrative purposes, but shall not be used to limit the scope of the present disclosure.

Figure 1:
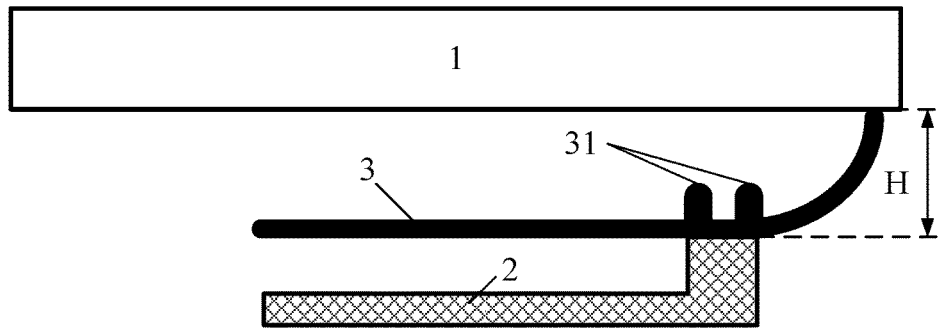
FIG. 1 is a schematic diagram of attaching a mask plate to a substrate in the prior art.
Figure 2:
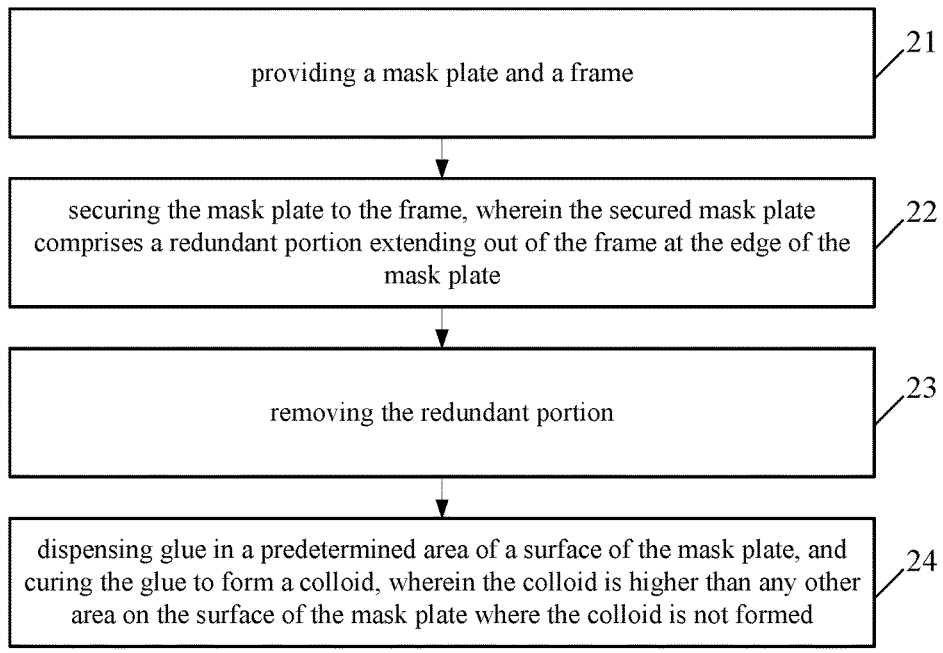
FIG. 2 is a flow chart showing a method for manufacturing a mask plate assembly according to embodiments of the present disclosure.

In order to avoid the phenomena that roughness occurs in the surface of the mask plate, the present disclosure provides in some embodiments a method for manufacturing a mask plate assembly, as shown in FIG. 2, the method includes:

a step 21 of providing a mask plate and a frame;

a step 22 of welding the mask plate to the frame, wherein the welded mask plate includes a redundant portion extending out of the frame;

a step 23 of removing at least a part of the redundant portions; and a step 24 of dispensing glue in a predetermined area of a surface of the mask plate, and curing the glue to form a colloid, wherein the colloid is higher than any other area on the surface of the mask plate where the colloid is not formed.

In the manufacturing method of the present embodiment, the mask plate is indirectly attached to the substrate by the colloid formed on the surface of the mask plate, resulting in a flatter attachment effect, that is, the opening of the mask plate is more strictly parallel to the substrate. Therefore, in the evaporation process using the mask plate assembly, films can be more accurately formed in predetermined areas through the opening, so as to improve the display quality.

In view of the fact that the warped portion and solder joints formed during the welding process may appear near the edge of the mask plate in practice, the glue may be dispensed near the edge portion of the mask plate at step 24 so that the colloid formed by curing the glue may cover the solder joints and warped portions.

It should be noted that the predetermined area for dispensing the glue is not necessarily near the edge of the mask plate, as long as the cured colloid may support the mask plate on the substrate, and the present disclosure is not intended to be limited thereto.

Hereinafter, the manufacturing method of the present embodiment will be described in details in conjunction with the accompanying drawings.

The manufacturing method of the present disclosure specifically includes the following steps.

Figure 3A:
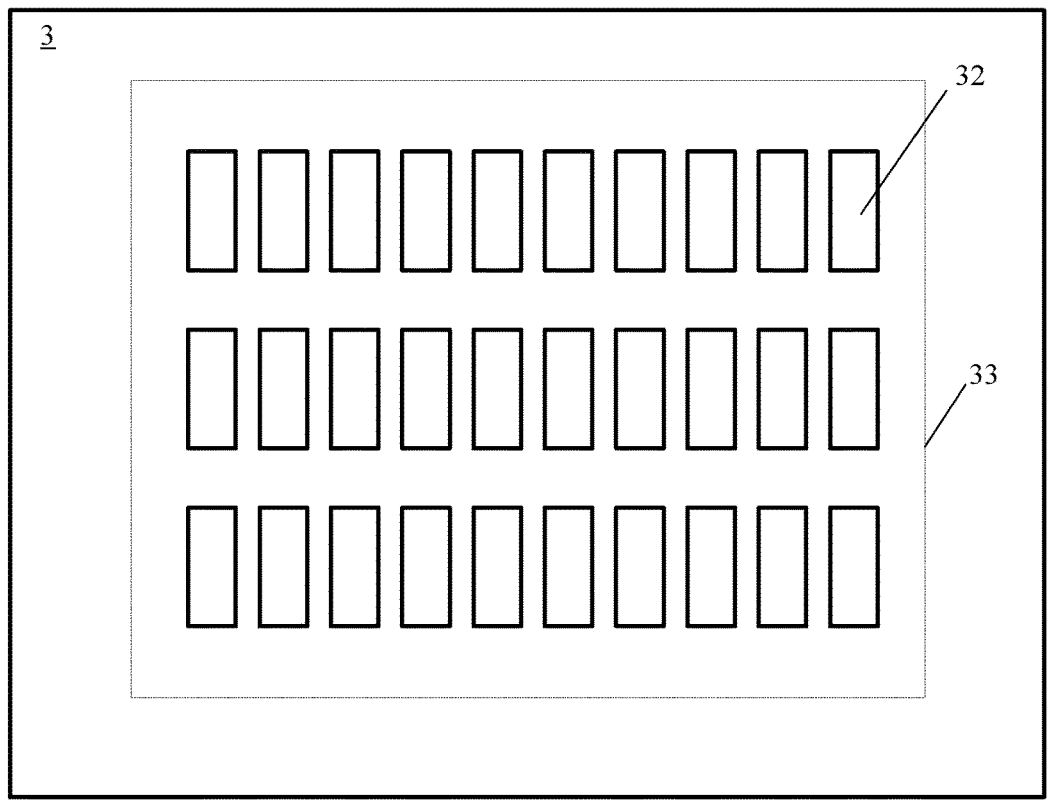
FIGS. 3A-3D are schematic diagrams showing a method for manufacturing a mask plate assembly according to embodiments of the present disclosure.

Step 31: as shown in FIG. 3A, a cutting line 33 is etched on a mask plate 3 having an opening 32 through which an evaporation device may form a film on the pixel area of the substrate in an evaporation process, wherein the cutting line 33 is of a shape of the frame 2, and the area of the mask plate 3 outside the cutting line 33 is the redundant portion of the mask plate 3 extending out of the frame 2.

Figure 3B:
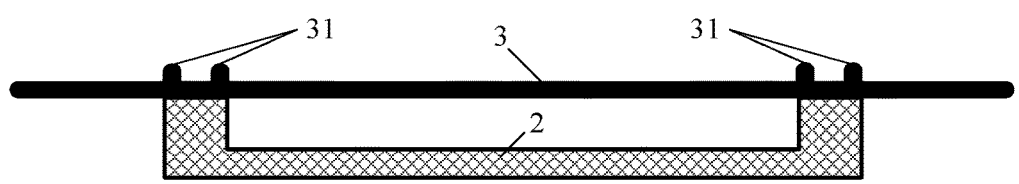

Step 32: as shown in FIG. 3B, the mask plate 3 is positioned on the frame 2, so as to weld the mask plate 3 onto the frame 2; and during welding, raised solder joints 31 are left at positions on the mask plate 3 corresponding to the frame 2.

Figure 3C:
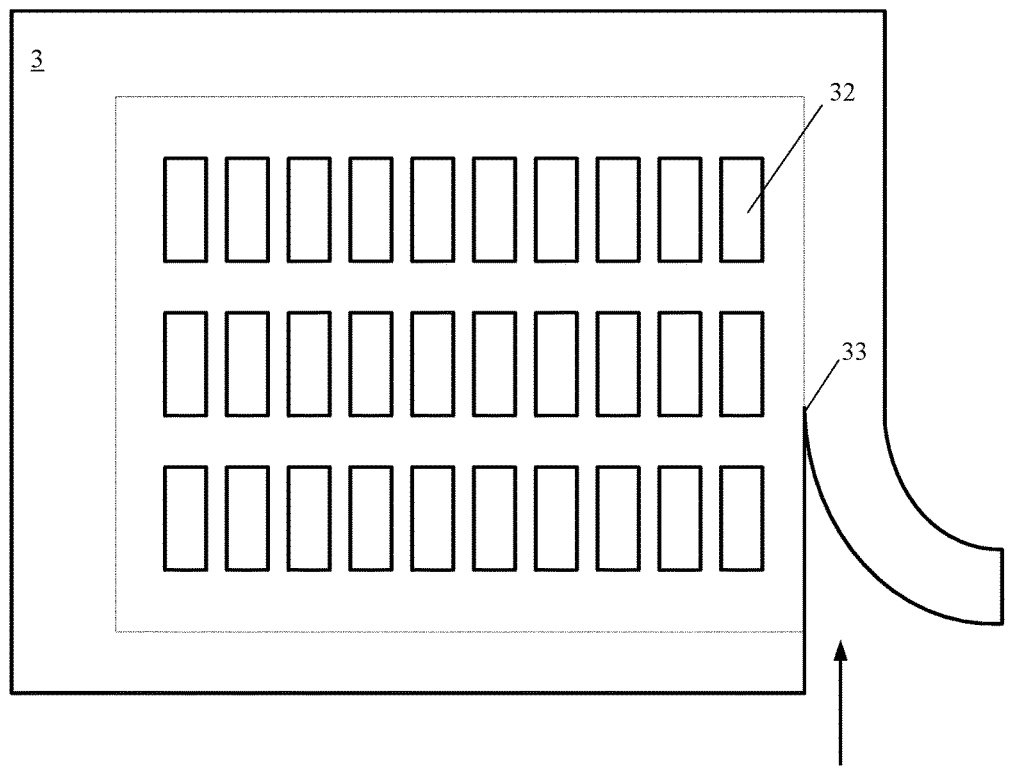
Figure 3D:
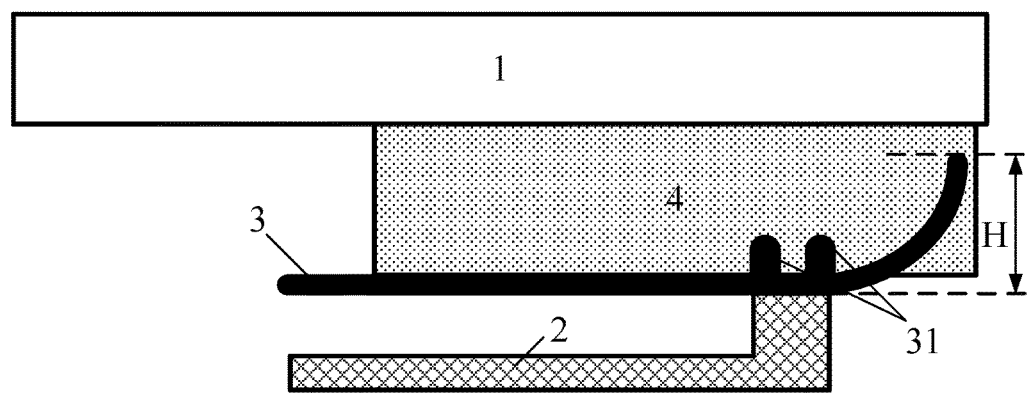

Step 33: as shown in FIG. 3C, the mask plate 3 is cut along the cutting line 33 to remove the redundant portion of the mask plate 3 that extends out of the frame 2; it should be noted that the redundant portion of the mask plate 3 might not be completely removed in the practical cutting process as in an ideal case, and warped edges (warped portions) extending out of the frame 2 will be left on the mask plate 3;

Step 34: as shown in FIG. 3D, after the mask plate 3 is cut, glue is dispensed near the edge of the surface of the mask plate 3, so as to form the cured colloid which is elastic (such as silicon rubber), wherein the colloid should be higher than the rest of the surface of the mask plate, e.g., the raised solder joints 31 and the warped edges (warped portions) caused by cutting the mask plate. As shown in FIG. 3D, the colloid 4 should cover the solder joints 31 and the warped portions. Thereafter, when the mask plate is attached to the substrate 1, the substrate 1 only contacts the colloid 4.

The above describes the manufacturing method of the present embodiment. It should be noted that the shapes of the mask plate and the frame shown in the drawings are for illustration purposes only, and are not intended to indicate that the mask plate and frame in practice must be of the shapes in the drawings of the present disclosure. A person skilled in the art may design the mask plate and the frame having any suitable shape based on actual requirements, and the present disclosure is not limited thereto.

In summary, when the above mask plate assembly is used for evaporation, the mask plate can be flatly attached to the substrate through the colloid. In addition, the colloid may also function as a buffer during the attaching process due to its elasticity, so as to prevent the substrate from being damaged by the mask plate.

In another aspect, the present disclosure provides in some embodiments a mask plate assembly as shown in FIG. 3D. The mask plate assembly includes:

a frame 2 and a mask plate 3 secured to the frame 2;

wherein a colloid 4 is formed in a predetermined area of the surface of the mask plate 3, and the colloid 4 is higher than the rest area of the surface of the mask plate where the colloid 4 is not formed.

In the mask plate assembly, the mask plate 3 may be indirectly and flatly attached to the substrate 1 through the colloid 4 formed on the surface.

The colloid is preferably made of an elastic material (such as silicon rubber), so as to function as a buffer during the attachment process, and prevent the substrate from being damaged by the mask plate.

Generally, the height of the colloid should be in a range of 50 μm-100 μm, ensuring that the colloid is not lower than the solder joints 31 and warped edge of the mask plate 3.

Further, the width of the colloid should be equal to or greater than 2000 μm-4000 μm, so as to facilitate supporting the mask plate on the substrate.

Correspondingly, the present disclosure further provides an evaporation device and a method of manufacturing a display substrate using the evaporation device. The evaporation device includes the above-mentioned mask plate assembly, and thus, during the processing of forming the film by evaporation, the mask plate can be flatly attached to the substrate through the colloid on the surface, so as to ensure the quality of the film.

Figure 4A:
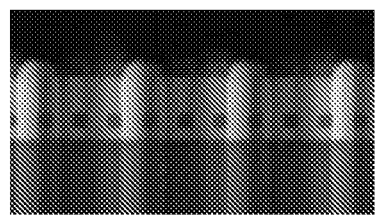
FIG. 4A is a schematic diagram showing display effect of a display device manufactured using an evaporation device in prior art.
Figure 4B:
FIG. 4B is a diagram showing display effect of a display device manufactured using the evaporation device according to the embodiments of the present disclosure.

For example, FIG. 4A is a schematic diagram showing the display effect of a display device manufactured using a conventional evaporation device, and FIG. 4B is a schematic diagram showing display effect of a display device manufactured using the evaporation device according to the embodiments of the present disclosure. By comparing FIGS. 4A and 4B, it is found that the opening on the mask plate cannot be strictly parallel to the substrate in prior art due to the fact that the mask plate cannot be completely attached to the substrate, so that the evaporation position of the film is not precise enough and shadows appear between the pixel areas. However, the evaporation device according to the present disclosure can effectively avoid the above-described problem and thus have a better display quality.

The present disclosure provides in some embodiments an evaporation device including the above-mentioned mask plate assembly.

In yet another aspect, the present disclosure also provides a method for manufacturing a display substrate. The method uses the above-mentioned mask plate assembly to deposit pixels on the substrate.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A method for manufacturing a mask plate assembly, the method comprising:
   providing a mask plate and a frame;
   securing the mask plate to the frame, wherein the secured mask plate comprises solder joints and a redundant portion extending out of the frame;
   removing at least a part of the redundant portion, wherein the redundant portion not removed is a warped portion of the secured mask plate; and
   forming a colloid without relative movement between the mask plate and the frame by dispensing glue in a predetermined area of a surface of the mask plate, and by curing the glue, wherein the predetermined area comprises an area near an edge of the secured mask, the predetermined area with the colloid is of a thickness greater than any other area on the surface of the mask plate where the colloid is not formed, and the colloid covers the solder joints, the warped portion of the mask plate, or the solder joints and the warped portion of the mask plate.

2. The method according to claim 1, further comprising:
   forming on the mask plate a cutting line which is of a shape corresponding to that of the frame, prior to securing the mask plate onto the frame, and
   the step of removing at least a part of the redundant portion comprising:
   cutting off the part of the redundant portion along the cutting line.

3. The method according to claim 2, wherein the step of securing the mask plate to the frame comprising:
   welding the mask plate onto the frame.

4. The method according to claim 1, wherein the step of securing the mask plate to the frame comprising:
   welding the mask plate onto the frame.

* * * * *